(12) United States Patent
Cook et al.

(10) Patent No.: US 8,242,033 B2
(45) Date of Patent: Aug. 14, 2012

(54) HIGH THROUGHPUT RECRYSTALLIZATION OF SEMICONDUCTING MATERIALS

(75) Inventors: Glen Bennett Cook, Elmira, NY (US); Prantik Mazumder, Ithaca, NY (US); Balram Suman, Painted Post, NY (US); Natesan Venkataraman, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 201 days.

(21) Appl. No.: 12/632,837

(22) Filed: Dec. 8, 2009

(65) Prior Publication Data

US 2011/0133202 A1    Jun. 9, 2011

(51) Int. Cl.
    *H01L 21/00* (2006.01)
(52) U.S. Cl. .......... 438/795; 438/758; 438/778; 257/75; 257/E21.24; 257/E21.294; 257/E21.317; 257/E29.002
(58) Field of Classification Search .......... 438/758, 438/778, 795; 257/75, E21.24, E21.294, 257/E21.317, E29.002
See application file for complete search history.

(56) References Cited

U.S. PATENT DOCUMENTS

| | | | |
|---|---|---|---|
| 3,948,650 A | 4/1976 | Flemings et al. | 75/135 |
| 4,112,135 A | 9/1978 | Heaps et al. | 427/11 |
| 4,128,680 A | 12/1978 | Heaps et al. | 428/137 |
| 4,137,355 A | 1/1979 | Heaps et al. | 428/201 |
| 4,243,472 A | 1/1981 | O'Neill | 156/624 |
| 4,251,570 A | 2/1981 | Zook | 427/74 |
| 4,315,479 A | 2/1982 | Toole et al. | 118/726 |
| 4,447,289 A | 5/1984 | Geissler et al. | 156/608 |
| 4,461,670 A | 7/1984 | Celler et al. | 156/603 |
| 4,778,478 A | 10/1988 | Barnett | 437/5 |
| 4,944,835 A | 7/1990 | Allen et al. | 156/620.7 |
| 5,165,463 A * | 11/1992 | Aghajanian et al. | 164/97 |
| 5,712,199 A | 1/1998 | Nakagawa et al. | 438/62 |
| 5,741,359 A | 4/1998 | Motoda et al. | 117/43 |
| 5,891,244 A | 4/1999 | Kim et al. | 117/200 |
| 6,231,667 B1 | 5/2001 | Iwane et al. | 117/55 |
| 6,581,415 B2 | 6/2003 | Chandra et al. | 65/66 |
| 6,596,075 B2 | 7/2003 | Igarashi et al. | 117/26 |
| 6,682,990 B1 | 1/2004 | Iwane et al. | 438/458 |
| 6,746,225 B1 | 6/2004 | McHugh | 425/130 |
| 6,802,900 B2 | 10/2004 | Iwane et al. | 117/54 |
| 6,946,029 B2 | 9/2005 | Tsukuda et al. | 117/16 |
| 7,071,489 B2 | 7/2006 | Tsukuda | 257/75 |

(Continued)

FOREIGN PATENT DOCUMENTS

JP    60-213351 A    10/1985

(Continued)

OTHER PUBLICATIONS

U.S. Appl. No. 12/466,104, filed May 14, 2009 "Method of Making an Article of Semiconducting Material on a Mold Comprising Particle of a Semiconducting Material".

(Continued)

*Primary Examiner* — Andy Huynh
(74) *Attorney, Agent, or Firm* — Michael W. Russell

(57) ABSTRACT

Methods for making and/or treating articles of semiconducting material are disclosed. In various methods, a first article of semiconducting material is provided, the first article of semiconducting material is heated sufficiently to melt the semiconducting material, and the melted semiconducting material is solidified in a direction substantially parallel to a shortest dimension of the melted article of semiconducting material. Articles of semiconducting materials made by methods described herein are also disclosed.

15 Claims, 4 Drawing Sheets

U.S. PATENT DOCUMENTS

| | | | |
|---|---|---|---|
| 7,111,476 B2 | 9/2006 | Loxley et al. | 65/17.2 |
| 7,186,578 B2 | 3/2007 | Goma et al. | 438/22 |
| 7,294,197 B1 | 11/2007 | Gralenski | 117/37 |
| 7,569,462 B2 | 8/2009 | Rana et al. | 438/490 |
| 2008/0142763 A1 | 6/2008 | Rana et al. | 252/501 |

FOREIGN PATENT DOCUMENTS

| | | |
|---|---|---|
| WO | WO 2005/104244 A1 | 11/2005 |
| WO | 2008/076730 A1 | 6/2008 |
| WO | WO 2009/002550 A1 | 12/2008 |
| WO | WO 2009/108358 A1 | 9/2009 |

OTHER PUBLICATIONS

U.S. Appl. No. 12/466,143, filed May 14, 2009 "Method of Making an Article on a Mold Comprising Semiconduction Material".

U.S. Appl. No. 12/394,608, filed Feb. 27, 2009 "Methods of Making an Unsupported Article of Semiconducting Material by Controlled Undercooling".

U.S. Appl. No. 61/067,679, filed Feb. 27, 2008 "Methods of Making an Unsupported Article of Pure or Doped Semiconducting Ellement or Alloy".

U.S. Appl. No. 12/156,499, filed Jun. 2, 2008 "Methods of Treating Semiconducting Materials".

Mazumder, P., and Trivedi, R., "Novel pattern forming process due to coupling of convection and phase change", Phys. Rev. Lett., vol. 88, 2002, pp. 235507.

Ciszek, T.F., "Review Paper: Techniques for the Crystal Growth of Silicon Ingots and Ribbons," Journal of Crystal Growth, vol. 66, 1984, pp. 655-672.

Yeckel, A., Salinger, A.G., and Derby, J.J., "Theoretical analysis and design considerations for float-zone refinement of electronic grade silicon sheets," Journal of Crystal Growth, vol. 152, 1995, pp. 51-64.

Kalejs, J. P., "Silicon ribbons and foils state of the art," Solar Energy Materials & Solar Cells, vol. 72, 2002, pp. 139-153.

Hanoka, J. I., "An overview of silicon ribbon growth technology," Solar Energy Materials & Solar Cells, vol. 65, 2001, pp. 231-237.

Tomoyuki, Takakura et al., "Effect of Rapid Thermal Process for CDS Silicon Solar Cell," poster, Sharp, Japan.

Mitsuyasu, Hidemi et al., "Characteristics of CDS Silicon Wafers," poster, Sharp, Japan.

Li, J.G. and Hausner, H., "Wetting and adhesion in liquid silicon/ceramic systems," Materials Letters, 14 (1992), pp. 329-332.

Turnbull, D., "Formation of Crystal Nuclei in Liquid Metals," Journal of Applied Physics, 21 (Oct. 1950), pp. 1022-1028.

Turnbull, D., "Kinetics of Heterogeneous Nucleation," Journal of Chemical Physics, vol. 18, No. 2 (Feb. 1950), pp. 198-203.

Turnbull, D. and Fischer, J.C., "Rate of Nucleation in Condensed Systems," Journal of Chemical Physics, vol. 17, No. 1 (Jan. 1949), pp. 71-73.

Bell, R. O., and Kalejs, J. P., "Growth of silicon sheets for photovoltaic applications," *Journal of Materials Research*, pp. 2732-2739, vol. 13, No. 10, Oct. 1998.

Deal, et al, "General Relationship for the Theremal Oxidation of Silicon", Journal of Applied Physics, 36, 3770 (1965).

Mullins, et al "Stability of a Planar Interface Dniing Solidification of a Dilute Binary Alloy," Journal of Applied Physics vol. 35, No. 2, Feb. 1964, pp. 449-451.

Kielibа, et al "Crystalline silicon thin-film solar cells on ZrSiO4 ceramic substrates," Solar energy Materials & Solar Cells 74 (2002) pp. 261-166.

Eyer, et al "Crystalline silicon thin-film (CSiTF) solar cells on SSP and on ceramic substrates," J. of Crystal Growth 225 (2001) pp. 340-347.

Reber, et al "Zone melting recrystallization of silicon films for crystalline silicon thin-film solar cells," Solar Energy Materials & Solar Cells 65 (2001) pp. 401-416.

Leamy, et al "Cellular Growth in Micro-Zone Melted Silicon," Materials Letters vol. 1, No. 1 pp. 33-36.

Fraunhofer Institute Solare Engeriesysteme "The ZMR 100 Zone Melting Recrystallization System for Silicon Films" Apr. 2003.

Fu, et al., "Influence of the Energy Density on the Structure and Morphology of Polycrystalline Silicon Films Treated With Electron Beam", Elsevier, Materials Science & Engineering B, vol. 136 (2007), pp. 87-91.

\* cited by examiner

HIGH THROUGHPUT RECRYSTALLIZATION OF SEMICONDUCTING MATERIALS

FIELD

The disclosure relates to methods of making and/or treating articles of semiconducting materials, and articles of semiconducting materials made and/or treated thereby.

BACKGROUND

Semiconducting materials are used in a variety of applications, and may be incorporated, for example, into electronic devices such as photovoltaic devices. Photovoltaic devices convert light radiation into electrical energy through the photovoltaic effect.

A photovoltaic device may comprise silicon, for example, as a semiconducting material. For silicon-based devices, silicon may be formed into a variety of shapes using a variety of techniques. Examples include silicon formed as an ingot, sheet, or ribbon. The silicon may be supported or unsupported by an underlying substrate. However, conventional methods of making supported and unsupported articles of silicon have a number of shortcomings.

Methods of making unsupported articles of semiconducting material, such as, for example, silicon sheets, may be slow or wasteful of the semiconducting material feedstock. Unsupported single crystalline semiconducting materials can be produced, for example, using the Czochralski process. However, such bulk methods may disadvantageously result in significant kerf loss when the material is cut into thin sheets or wafers. Additional methods by which unsupported polycrystalline semiconducting materials can be produced include electromagnetic casting and ribbon growth techniques. However, these techniques tend to be slow and expensive. Polycrystalline silicon ribbon produced using silicon ribbon growth technologies is typically formed at a rate of only about 1-2 cm/min.

Supported semiconducting material sheets may be produced less expensively, but the semiconducting material sheet may be limited by the substrate on which it is formed, and the substrate may have to meet various process and application requirements, which may be conflicting.

Methods for producing unsupported polycrystalline semiconducting materials are disclosed in commonly-owned U.S. Provisional Patent Application No. 61/067,679, filed Feb. 29, 2008, titled "Method of Making an Unsupported Article of a Pure or Doped Semiconducting Element or Alloy," and PCT Publication No. WO09/108,358, published Sep. 3, 2009, titled "Methods of Making an Unsupported Article of Pure of Doped Semiconducting Element or Alloy," the disclosures of which are hereby incorporated by reference.

The properties of semiconducting materials may depend on a variety of factors, including crystal grain structure, the concentration and type of intrinsic defects, and the presence and distribution of dopants or other impurities. Within a semiconducting material, the crystal grain size, grain size distribution, and grain orientation, for example, can impact the performance of resulting devices. By way of example, the electrical conductivity and thus the overall efficiency of a semiconductor-based device, such as a photovoltaic cell, will generally improve with larger and more uniform grains.

It is known that an increase in production throughput may lead to a decrease in crystal grain quality and, therefore, a decrease in the efficiency of resulting semiconductor-based devices. One solution is to decouple the process of making an article of semiconducting material (e.g., silicon sheet) from the process of improving grain structure and/or otherwise minimizing defects. An objective would be to produce the semiconducting material with a desired geometry (e.g., thickness, width, and/or length) in a first high-throughput step, followed by a second step where the grain structure, defect concentration, etc. are modified. Examples of methods that decouple the processes are described in U.S. application Ser. No. 12/156,499, filed Jun. 2, 2008, titled "Methods of Treating Semiconducting Materials and Treated Semiconducting Materials," the disclosure of which is incorporated herein by reference.

Additional methods, such as the Zone Melt Recrystallization (ZMR) process and the related approaches described in WO 2009/002550 A1 and "The ZMR 100 Zone melt Recrystallization System for Silicon Films," Fraunhofer Institut Solar Energiesysteme, melt and resolidify semiconducting material in a lateral direction by scanning a heat source along the substrate plane or vice versa. These ZMR methods suffer from disadvantages, however, such as a less-than-desired throughput.

As described herein, the inventors have now discovered additional methods by which articles of semiconducting materials may be made, and/or methods for treating articles of semiconducting materials. The disclosed methods may facilitate formation of articles of semiconducting materials having desirable attributes such as, for example, one or more of improved crystal grain structure, reduced defects, low surface roughness, and uniform thickness, while reducing material waste and increasing the rate of production.

SUMMARY

In accordance with various exemplary embodiments of the disclosure are provided methods for making a second article of semiconducting material comprising providing a first article of semiconducting material, heating the first article of semiconducting material sufficiently to melt the first article of semiconducting material, and solidifying the melted first article of semiconducting material in a direction substantially parallel to the shortest dimension of the melted first article of semiconducting material.

Other exemplary embodiments according to the disclosure relate to methods of treating a first article of semiconducting material comprising heating the first article of semiconducting material sufficiently to melt the first article of semiconducting material, and solidifying the melted first article of semiconducting material in a direction substantially parallel to the shortest dimension of the melted first article of semiconducting material. The foregoing methods of making a second article and treating the first article of semiconducting material may improve at least one of crystal grain structure and/or surface properties of the first article of semiconducting material.

Other exemplary embodiments relate to a second article of semiconducting material made by heating a first article of semiconducting material sufficiently to melt the first article of semiconducting material, and solidifying the melted first article of semiconducting material in a direction substantially parallel to the shortest dimension of the melted first article. The second article of semiconducting material may have improved crystal grain structure and/or surface properties.

As used herein, the term "semiconducting material" includes materials that exhibit semiconducting properties, such as, by way of nonlimiting example, silicon, germanium, alloys and compounds of tin, gallium arsenide, titanium dioxide, alloys thereof, compounds thereof, and mixtures thereof. In various embodiments, the semiconducting material may be pure (such as, for example, intrinsic or i-type silicon) or doped (such as, for example, silicon containing a n-type or p-type dopant, such as phosphorous or boron, respectively).

As used herein, the phrase "article of semiconducting material" includes any shape or form of crystalline or amorphous semiconducting material. Examples of such articles include articles that are smooth or textured; articles that are flat, curved, bent, or angled; articles that are symmetric or asymmetric; and articles that comprise various forms such as, for example, sheets, films, wafers, ingots, ribbons, or rods. In one embodiment, the article of semiconducting material may have at least one substantially planar surface. In another embodiment, the article of semiconducting material may comprise, for example, a sheet having a thickness ranging from about 25 µm to about 5000 µm, such as, for example, from about 100 µm to about 300 µm, and a length and a width, independently of one another, ranging from about 75 µm to about 500 cm, such as, for example, from about 250 µm to about 250 cm, further such as, for example, from about 500 µm to about 15 cm.

As used herein, the term "unsupported" refers to free-standing articles of semiconducting material (i.e., the article of semiconducting material is not integral with a substrate).

As used herein, the term "supported" refers to articles of semiconducting material attached, for example, by at least one chemically bond, to a substrate and/or at least one article of semiconducting material.

As used herein, the term "first article of semiconducting material" means any article of semiconducting material which is provided prior to the heating step described herein. For example, as described above, the first article of semiconducting material may be, in at least one embodiment, a net-shaped silicon film, such as one made by an exocasting process as disclosed in U.S. patent Application No. PCT/US09/01268.

As used herein, the term "second article of semiconducting material" means any article of semiconducting material formed from a first article of semiconducting material that has been subjected to the heating and solidification steps as described herein. In one embodiment, the "second article of semiconducting material" may retain the overall composition, geometry, shape, and/or form of the corresponding first article of semiconducting material.

As used herein, the term "alloy" means a homogenous mixture of solid solution of at least two metals, the atoms of one metal replacing or occupying interstitial positions between the atoms of the other.

As used herein, the term "substantially planar surface" means any substantially flat surface (i.e., where the intrinsic curvature is substantially zero). It is understood that in the context of the present disclosure, while the overall surface (i.e., on a macro scale) of an article of semiconducting material may be considered to be substantially planar, inspection of the surface at any particular location (i.e., on a micro scale) may show some surface irregularities. A surface which is substantially planar on the macro scale, but which may have such micro surface irregularities, is considered, for purposes of the disclosure, to be "substantially planar."

As used herein, the term "substantially parallel" means extending in substantially the same direction and substantially equidistant at all points. It is understood that in the context of the present disclosure, while lines and/or planes may be considered substantially parallel overall (i.e., on a macro scale), inspection of those lines and/or planes at any particular location (i.e., on a micro scale) may show some irregularities in direction (i.e., not substantially parallel). Lines and/or planes which are substantially parallel on the macro scale, but which may have such micro irregularities in direction, are considered, for purposes of the disclosure, to be "substantially parallel."

As used herein, the term "substantially perpendicular" means a line or plane that intersects and forms substantially right angles to another given line or plane. It is understood that in the context of the present disclosure, while lines and/or planes may be considered substantially perpendicular overall (i.e., on a macro scale), inspection of those lines and/or planes at any particular location (i.e., on a micro scale) may show some irregularities in direction (i.e., not substantially perpendicular). Lines and/or planes which are substantially perpendicular on the macro scale, but which may have such micro irregularities in direction, are considered, for purposes of the disclosure, to be "substantially perpendicular."

As used herein, the term "substantially stationary" as used with respect to an article of semiconducting material, means having no or only minimal movement in a direction substantially perpendicular to the shortest dimension of the melted article of semiconducting material. For example, in one embodiment, the first article of semiconducting material and/or the melted first article of semiconducting material may remain substantially stationary during the heating and directional solidification steps, respectively. It is understood that in the context of the present disclosure, while the first article of semiconducting material and/or melted first article of semiconducting material may remain substantially stationary overall (i.e., on a macro scale) during the heating and directional solidification steps, inspection of the first article of semiconducting material and/or melted first article of semiconducting material at any particular location (i.e., on a micro scale) may show some irregularities in movement (i.e., not substantially stationary). A first article of semiconducting material and/or a melted first article of semiconducting which are substantially stationary on the macro scale, but which may have such micro irregularities in movement, are considered, for purposes of the disclosure, to be "substantially stationary."

As used herein, the phrase "shortest dimension of the melted first article of semiconducting material" means the shortest dimension of the melted first article of semiconducting material irrespective of its directional orientation as compared to the first article of semiconducting material. For example, in one embodiment, the first article of semiconducting material may be partially melted to make a melt pool of the first article of semiconducting material and the shortest dimension of the melt pool may be in a substantially different direction than the shortest dimension of the first article of semiconducting material. In another embodiment, the direction of the shortest dimension of the melt pool may be in the substantially same direction as the shortest dimension of the first article of semiconducting material.

As used herein, the term "substrate" means any base or top (i.e., "superstate") layer of a structure, which remains in substantially solid form above the melting point of the semiconducting material and which does not react (i.e., is substantially chemically inert) with the semiconducting material or the capping layer, as described herein. The substrate may be in contact with the entire surface of the first article of semiconducting material and/or at least one capping layer, or it may be in contact with only portions of the first article of semiconducting material and/or at least one capping layer, such as the ends or edges of the first article of semiconducting material and/or at least one capping layer. The substrate may in some embodiments comprise a refractory material, such as, for example, silicon dioxide. Other materials may also be used to form the substrate, and may, in some embodiments, be chosen based on the material's ability to resist high temperatures and/or reduce the risk of contaminating the first article of semiconducting material with impurities. The substrate may in some embodiments comprise a heat source.

As used herein, the phrase "increased rate of production" and variations thereof include any increase in the rate of article of semiconducting material production with respect to conventional methods for producing articles of semiconducting material, such as ribbon growth methods. For example, an increased rate of production may be any rate greater than 1-2 cm/min.

As used herein, the phrase "reduced material waste" and variations thereof mean any reduction in the amount of semiconducting material lost through conventional methods using slicing or cutting following production of the article of semiconducting material.

As used herein, the term "crystal grain structure" includes grain size, grain shape, uniformity of grain size, uniformity of grain shape, and/or uniformity of grain direction.

As used herein, "improved crystal grain structure" and variations thereof mean an improvement in any one or more crystal grain feature of the semiconducting material, such as, for example, crystal grain texture, crystal grain uniformity, and crystal grain size and/or shape, crystal grain orientation, and/or may reduce the amount of post-processing the second article of semiconducting material may be required to undergo as compared to conventional methods for producing semiconducting material.

As used herein, the term "columnar grain" includes crystals that grow in a direction substantially parallel to the shortest dimension of the melted first article of semiconducting material.

As used herein, "improved surface property" means an improvement in any one or more surface property, such as, for example, surface topography and surface appearance. Improved surface property may also include an improvement in the thickness of the article of semiconducting material, such as, for example, creating a uniform thickness and/or reducing the thickness of the article of semiconducting material.

As used herein, the term "crystalline" means any material comprising a crystal structure, including, for example, multicrystalline semiconducting materials.

As used herein, the term "multicrystalline" includes any material comprised of a plurality of crystal grains.

As used herein, the term "amorphous" includes any material lacking long range order.

As used herein, the phrase "heat content of the melted first article of semiconducting material" and variations thereof mean the average heat content of the melted first article of semiconducting material. Localized temperatures within the molten semiconducting material may vary at any point in time, such as, for example, areas of the molten semiconducting material close to the heat source when the first article of semiconducting material is heated, or molten semiconducting material exposed to the atmospheric conditions. In various embodiments, the average heat content of the molten semiconducting material is substantially uniform despite any localized temperature variation.

As used herein, the term "melt pool" means an amount of molten material collected on or within a first article of semiconducting material, wherein the molten material comprises approximately the same composition as the first article of semiconducting material and is formed by exposing the first article of semiconducting material to a heat source sufficient to cause at least a portion of the first article of semiconducting material to become molten.

As used herein, the phrase "heating the first article of semiconducting material sufficiently to melt the first article of semiconducting material" means that the first article of semiconducting material is heated sufficiently to partially or completely melt the first article of semiconducting material in any direction. For example, in one embodiment, the first article of semiconducting material may be heated sufficiently to partially or completely melt the first article of semiconducting material in a direction originating from the top, bottom, and/or any at least one side of the first article of semiconducting material.

As used herein, the terms "melted," "molten," and variations thereof are interchangeable.

As used herein, the term "capping layer" means any material or materials that may be deposited and/or formed on at least one surface, in whole or in part, of the first article of semiconducting material prior to the heating step described herein in order to substantially inhibit the reduction of the surface area of the molten first article of semiconducting material.

As used herein, the term "solidification" and variations thereof mean to make solid (i.e., to change from a liquid to a solid form).

As used herein, the term "directional solidification" means the method of solidifying the melted first article of semiconducting material in a direction substantially parallel to the shortest dimension of the melted first article of semiconducting material.

As used herein, the term "solid/liquid interface" means a surface regarded as the common boundary that substantially separates the solid semiconducting material and the liquid (i.e., melted) semiconducting material. It is understood that in the context of the present disclosure, while the overall solid/liquid interface (i.e., on a macro scale) may be substantially perpendicular to the shortest dimension of the melted first article of semiconducting material, inspection of the solid/liquid interface at any particular location (i.e., on a micro scale) may show some irregularities in direction (i.e., not substantially perpendicular). A solid/liquid interface which is substantially perpendicular to the shortest dimension of the melted first article of semiconducting material on the macro scale, but which may have such micro irregularities in direction, is considered, for purposes of the disclosure, to be a "solid/liquid interface."

As used herein, the term "vertical direction" and variations thereof means in a direction substantially parallel to the shortest dimension of the melted first article of semiconducting material.

As used herein, the term "lateral direction" and variations thereof means in a direction substantially perpendicular to the shortest dimension of the melted first article of semiconducting material.

As described herein, the disclosure relates to methods of making or treating articles of semiconducting materials and articles of semiconducting materials made and/or treated thereby. In the following description, certain aspects and embodiments will become evident. It should be understood that the invention, in its broadest sense, could be practiced without having one or more features of these aspects and embodiments. It should be further understood that these aspects and embodiments are merely exemplary and explanatory, and are not restrictive of the invention as claimed.

Other features and advantages of the invention will be apparent from the following description and the appended claims.

BRIEF DESCRIPTION OF DRAWINGS

The following figures, which are described below and which are incorporated in and constitute a part of the specification, illustrate exemplary embodiments according to the disclosure and are not to be considered limiting of the scope of the invention, for the invention may admit to other equally effective embodiments. The figures are not necessarily to scale, and certain features and certain views of the figures may be shown exaggerated in scale or in schematic in the interest of clarity and conciseness.

DETAILED DESCRIPTION

Figure 1:
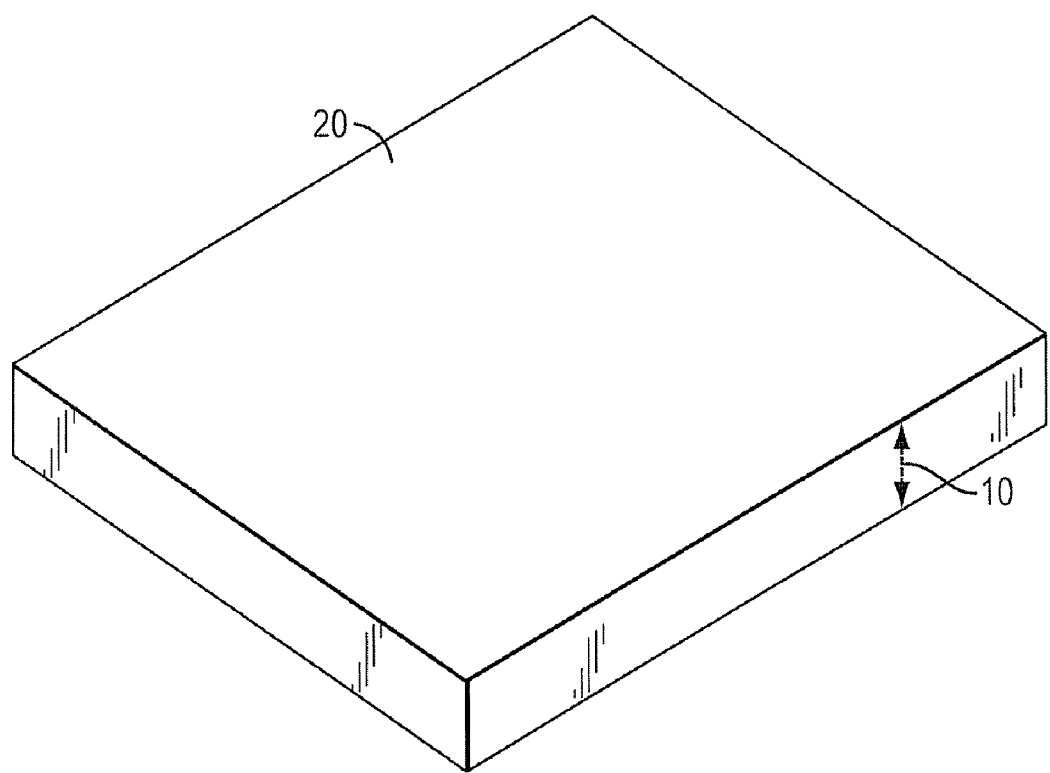
FIG. 1 is a schematic representation of the shortest dimension of the melted first article of semiconducting material according to an exemplary embodiment of the disclosure.

Reference will now be made to various exemplary embodiments, at least one example of which is illustrated in the accompanying figures. However, these various exemplary embodiments are not intended to limit the disclosure, but rather numerous specific details are set forth in order to provide a thorough understanding of the invention. It will be apparent to one skilled in the art that the invention may be practiced without some or all of these specific details and the disclosure is intended to cover alternatives, modifications, and equivalents. For example, well-known features and/or process steps may not have been described in detail so as not to unnecessarily obscure the invention. In the accompanying drawings, like or identical reference numerals are used to identify common or similar elements.

The present disclosure contemplates various exemplary methods for making a second article of semiconducting material or treating a first article of semiconducting material, comprising providing a first article of semiconducting material, heating the first article of semiconducting material sufficiently to melt the first article of semiconducting material, and solidifying the melted semiconducting material in a direction substantially parallel to the shortest dimension of the melted first article of semiconducting material, such as in the direction of thickness (e.g., about 200 microns). An exemplary embodiment of the shortest dimension 10 of the melted first article of semiconducting material 20 can be seen in the dotted line in FIG. 1. In one embodiment, the first article of semiconducting material may be partially or completely melted, followed by solidification in a direction substantially parallel to the shortest dimension of the melted first article of semiconducting material (e.g., thickness). The present disclosure also contemplates various exemplary embodiments of second articles of semiconducting material made by the processes described herein.

In exemplary embodiments according to the disclosure, methods by which a first article of semiconducting material, for example net-shaped silicon (e.g., 15 cm×15 cm×200 microns), is formed may be decoupled from methods to refine grain size and defect density. In a first step, a first article of semiconducting material may be formed by any method known to those skilled in the art. By way of example only, silicon of the desired thickness may be produced at a high throughput by the exocasting processes disclosed in U.S. Patent Application No. PCT/US09/01268. A high throughput, such as a throughput of 6000 $cm^2$/min or even greater, may be achieved by these processes. With multiplexing (i.e., multiple first articles of semiconducting material formed simultaneously), the throughput may be increased significantly, allowing for efficient utilization of melter/furnace space.

The first article of semiconducting material formed by these high throughput processes may not, in some embodiments, have optimal crystal quality (e.g., size distribution, orientation, defect density, surface properties) for the intended application. This may be due to an inverse relationship between high dip/pull speed (throughput) and defect concentration. As such, the first article of semiconducting material may be further processed according to various methods described herein.

After providing the first article of semiconducting material, the first article of semiconducting material may be heated sufficiently to partially or completely melt the first article of semiconducting material, and then solidified in a direction substantially parallel to the shortest dimension of the melted first article of semiconducting material. In at least some embodiments, the first article of semiconducting material may be provided on a substrate for the heating and/or directional solidification steps. Nonlimiting examples of substrates include ceramic, glass, and graphite substrates, and mixtures thereof. In further exemplary embodiments, the substrate material may be a mixture which comprises dispersed particles of the semiconducting material itself, such as in reduced form. For example, the substrate may comprise a silicon/silica composite. By properly choosing the substrate material (e.g., thermal conductivity, density, specific heat, porosity, thickness, etc.) and process parameters (e.g., substrate temperature, heat source temperature, etc.), a relatively low thickness variability may be achieved in the second article of semiconducting material formed.

In various exemplary embodiments, a first article of semiconducting material may be heated by at least one heat source. For example, in one embodiment, heating the first article of semiconducting material comprises exposing a bottom or top surface of the first article of semiconducting material to a heat source. In another embodiment, heating the first article of semiconducting material comprises exposing a top surface of the first article of semiconducting material to a first heat source and a bottom surface of the first article of semiconducting material to a second heat source, which may be identical to or different than the first heat source.

One of skill in the art will be able to determine heating techniques and parameters for heating the first article of semiconducting material useful according to any particular embodiment of the methods described herein. In various exemplary embodiments, the heat source may be locally applied and of sufficient thermal flux to melt the first article of semiconducting material. Any method of heating capable of providing sufficient heat flux to partially or completely melt the first article of semiconducting material may be used, such as, for example, any of the heating methods disclosed and claimed in U.S. patent application Ser. No. 12/156,499. Such heating methods include, for example, combustion heat sources (torches), electrical discharge sources (plasma), infrared emission (resistance elements, bulbs), and any combination thereof. Further, the heat source may, in various exemplary embodiments, be chosen from a heat reservoir (i.e., any material that can be heated, including, for example, a graphite block), a hydrogen/oxygen torch, a hydrogen/halogen torch (e.g., a hydrogen/chlorine torch), a tungsten inert gas (TIG) torch, optionally comprising a silicon dioxide enclosed tungsten electrode, an IR lamp, such as, for example, a halogen lamp and a laser array, an argon or helium plasma torch, an electrical discharge source, an arc lamp, and a carbon rod, such as an RF-heated carbon rod, which may optionally be enclosed to prevent carbon from entering or otherwise contaminating the melted semiconducting material, and combinations thereof.

In certain exemplary embodiments, it may be advantageous to use a heat source that will not cause contamination of the melted first article of semiconducting material. By way of example, when the first article of semiconducting material being treated is silicon, a heat source with a silica nozzle may be used. In other exemplary embodiments, it may be advantageous to use a hydrogen/oxygen torch with an excess of hydrogen. The heat source may, in certain embodiments, be a single orifice nozzle type, or multiple, line, or shaped nozzle. In at least one embodiment, the heat source may comprise multiple, line, or shaped radiative heat sources.

The appropriate heating parameters for melting the first article of semiconducting material may easily be determined by one skilled in the art for any particular embodiment. For example, one skilled in the art may choose the size and/or shape of the heat source to be commensurate with the size and/or shape of the first article of semiconducting material, the desired melt pool of semiconducting material, or both. In addition, the flow rate of the heat and the length of time the heat is applied may be varied according to, for example, the size of the melt pool to be created, the heat flux to be controlled, and other factors which one of skill in the art practicing the invention can easily determine. The heat source may, in some embodiments, comprise multiple heat sources, such as, for example, multiple heat sources arranged in an array. The heat source may, in various exemplary embodiments, be fixed or movable. The heat source may also, in various embodiments, be combined, i.e., a "hybrid heat source." As a non-limiting example, a hybrid heat source may comprise an IR lamp combine with a torch or arc.

A suitable temperature for creating the melt pool may be, for example, the melting temperature of the semiconducting material, or higher. For example, the first article of semiconducting material may be heated to a temperature ranging from about 900° C. to about 1650° C. or higher. By way of non-limiting example, the semiconducting material may be heated from about 1350° C. to about 1450° C. As a further non-limiting example, in one embodiment where the first article of semiconducting material is silicon, it may be heated from 1414° C. to about 1650° C. One of skill in the art will appreciate that the suitable temperature for creating a melt pool may vary depending on factors such as, for example, the composition of the first article of semiconducting material, the conditions under which it is heated, etc.

It may be possible, in some embodiments, to monitor the application of the heat flux by observing changes in emissivity of the first article of semiconducting material. For example, in an embodiment where the semiconducting material is chosen from silicon or a silicon alloy, upon application of the heat source the increase in temperature can be monitored by increasing incandescence. Upon melting, however, the emissivity may drop with a corresponding decrease in brightness, despite the fact that the melted area is hotter. When viewed, for example through welders' glass, the skilled artisan may note that the unmelted material is brighter, and may therefore be able to determine the point at which the melt pool is created.

A desirable heating method and parameters for heating according to any particular embodiment may depend on, for example, the semiconducting material that the first article of semiconducting material is comprised of, whether it is doped, whether partial or complete melting is desired, the desired properties of the second article of semiconducting material, and other parameters that are well within the ability of those skilled in the art to determine and evaluate.

In various embodiments, due to surface tension of various semiconducting materials, for example, silicon (about 600 dynes/cm), additional steps may optionally be taken prior to heating. A high-tension liquid film has a natural tendency to contract its surface area to minimize surface energy and "ball up." Thus, upon melting, the liquid film may not be flat on the substrate, which may be used in some embodiments. In at least one embodiment, it may be desirable to have a thickness large enough so that gravity can overcome the contracting force of surface tension. In another embodiment, a capping layer may be deposited or formed on at least one surface of the first article of semiconducting material prior to or during heating. One of skill in the art can easily determine whether such a capping layer may be desirable for any particular embodiment.

Once the first article of semiconducting material is partially or completely melted by the heating step, the melted first article of semiconducting material is solidified in a direction substantially parallel to the shortest dimension of the melted first article of semiconducting material by extracting the heat content thereof. Without wishing to be bound by theory, it is believed that the directional solidification may, at least in part, control the final microstructure (i.e., grain size, orientation, etc.) and defect density of the second article of semiconducting material. Since both of these properties depend strongly on the solid-liquid interface shape and the solid-liquid interface velocity (i.e., solidification speed), by properly controlling the directional solidification rate, the second article of semiconducting material may be grown with large columnar grains as well as low defect density. In at least one embodiment, the solid-liquid interface remains substantially perpendicular to the shortest dimension of the melted first article of semiconducting material. The solid-liquid interface may, for example, move from at least one surface of the molten first article of semiconducting material to the opposite surface, or vice versa, while remaining substantially perpendicular to the shortest dimension of the melted first article of semiconducting material. In further embodiments, the solid-liquid interface may move at the same or varying speeds from at least one surface and at least one additional surface (e.g., directional solidification from two or more sides), regardless of the source(s) of the thermal energy. In at least some embodiments, it may be important to have as homogeneous a temperature distribution in the lateral direction as possible to ensure that the solid-liquid interface remains substantially perpendicular to the shortest dimension of the melted first article of semiconducting material at any point during the directional solidification step.

In one embodiment, the first article of semiconducting material, melted first article of semiconducting material, at least one heat source, and/or at least one substrate may remain substantially stationary during the heating and/or solidifying steps described herein. For example, in one embodiment, the first article of semiconducting material may be heated sufficiently to partially or completely melt the first article of semiconducting material while the first article of semiconducting material and/or the at least one heat source may remain substantially stationary, and the melted first article of semiconducting material is solidified in a direction substantially parallel to the shortest dimension of the melted first article of semiconducting material while the melted first article of semiconducting material and/or the at least one heat source may remain substantially stationary. In another embodiment, the melted first article of semiconducting material may remain substantially stationary while the at least one heat source may be moved in a vertical direction away from the melted first article of semiconducting material to solidify the melted first article of semiconducting material.

Figure 2A:
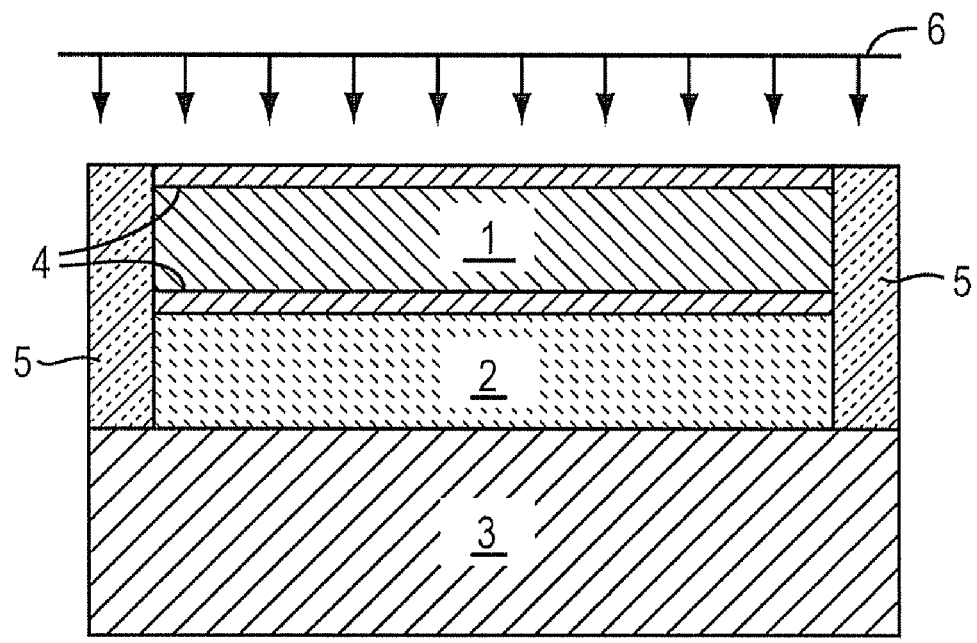
FIG. 2A is a schematic of a first article of semiconducting material according to an exemplary embodiment.
Figure 2B:
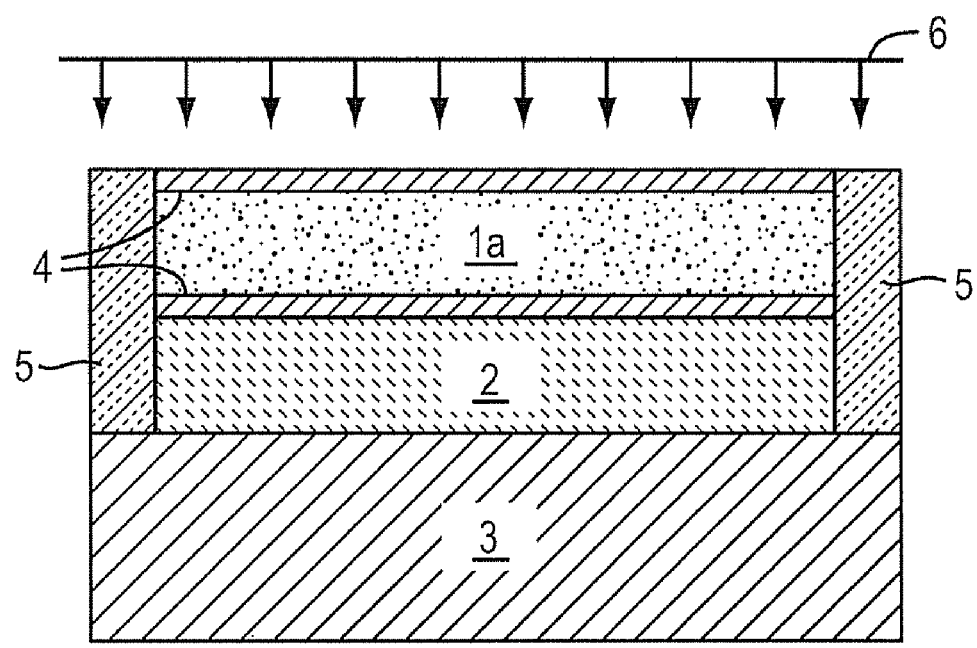
FIG. 2B is a schematic of heating of a first article of semiconducting material according to an exemplary embodiment.

An exemplary embodiment of the heating and directional solidification process described herein is shown in FIGS. 2A, 2B, 2C, and 2D. In the exemplary embodiment shown in FIG. 2A, a first article of semiconducting material, such as, for example, silicon 1, is provided. The heating and directional solidification process shown in FIGS. 2B and 2C may be applied to any first article of semiconducting material, and one of skill in the art can readily determine what, if any, variations are necessary depending on, for example, the type and thickness of the first article of semiconducting material used, the properties desired in the solidified semiconducting material, and/or the type of heat source. In the exemplary embodiment shown in FIG. 2A, the process starts with placing the first article of semiconducting material, silicon 1, on a substrate 2, such as a high temperature ceramic substrate, which is in contact with a heat reservoir 3. Before placing the silicon 1 on the substrate 2, capping layers 4 are deposited on two substantially planar surfaces of the silicon 1, although in other embodiments at least one capping layer may be deposited on at least one surface of the first article of semiconducting material before and/or after the first article of semiconducting material is placed on the optional substrate, or no capping layer is deposited on the first article of semiconducting material at any time. The temperature of the heat reservoir 3 may be changed at a desired rate. At least one insulating layer, such as, for example, silica, may be provided on at least one surface of the first article of semiconducting material. For example, as seen in FIG. 2A, the two vertical sides of the silicon 1 are framed by two insulating layers 5. The purpose of the vertical insulating layers 5 on the two sides of the silicon 1 is to minimize the temperature gradient in the lateral directions and solidify in the direction of the shortest dimension of the melted first article of semiconducting material. A top heater 6 is placed above the silicon 1. In the exemplary embodiment of FIG. 2B, the purpose of the top heater 6 is to completely melt the silicon 1. The top heater 6 in FIG. 2B is set at a temperature higher than the melting point of silicon 1 and the temperatures of both the top heater 6 and the heat reservoir 3 are held for a period of time sufficient to completely melt the entire silicon 1a, although in other embodiments the silicon 1 may only be partially melted. At this stage, the silicon 1 is fully melted 1a between the capping layers 4 as shown in FIG. 2B.

Figure 2C:
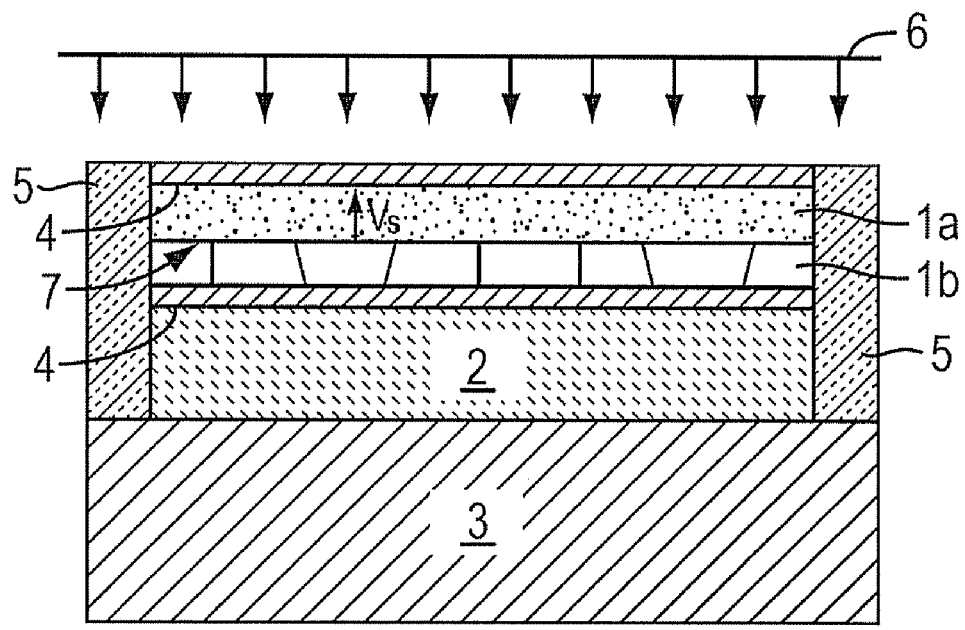
FIG. 2C is a schematic of directional solidification of a melted first article of semiconducting material according to an exemplary embodiment.
Figure 2D:
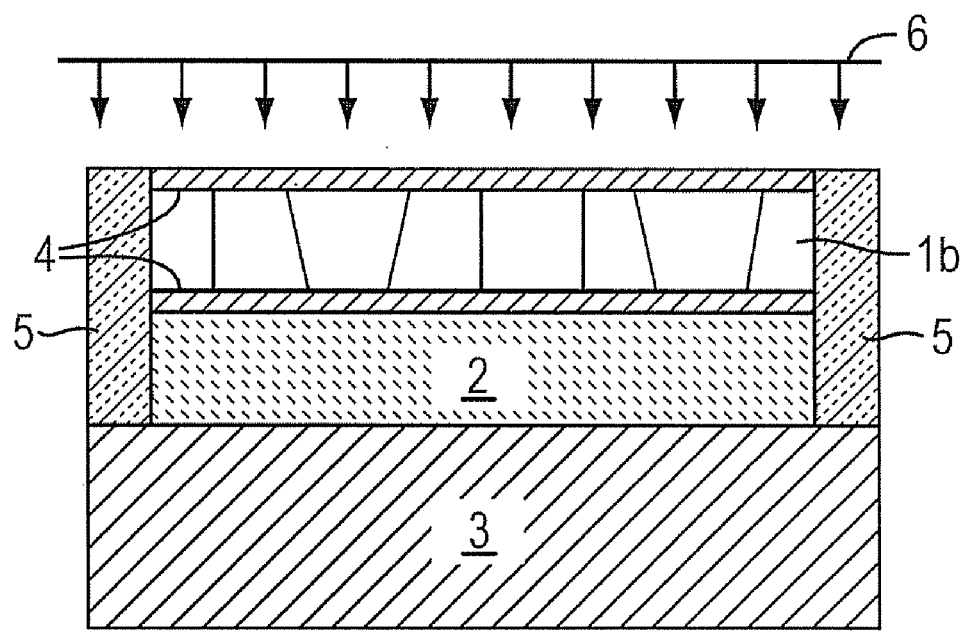
FIG. 2D is a schematic of a second article of semiconducting material according to an exemplary embodiment.

Subsequently, as seen in FIG. 2C, the temperature of the heat reservoir 3 may be decreased at a controlled rate to directionally solidify the melted silicon 1a from the bottom towards the top, i.e., in a direction substantially parallel to the shortest dimension of the melted silicon 1a. It may also be seen in FIG. 2C that the solid (1b)-liquid (1a) interface 7 remains substantially perpendicular to the shortest dimension of the melted silicon 1a during directional solidification. After the directional solidification step, as seen in FIG. 2C, the melted silicon 1a is a solidified silicon second article of semiconducting material 1b, as seen in FIG. 2D. In one embodiment, the silicon 1, melted silicon 1a, solidified silicon 1b, substrate 2, heat reservoir 3, capping layers 4, vertical insulating layers 5, and/or top heater 6 may be held substantially stationary during the heating and/or direction solidification steps shown in exemplary embodiments FIGS. 2B and 2C.

In general, the directional solidification may be initiated from the top surface and/or the bottom surface of the first article of semiconducting material. In an embodiment where solidification is from the bottom surface, as shown in FIG. 2C, directional solidification may be achieved by lowering the temperature of the heat reservoir 3, for example slowly lowering the temperature of the heat reservoir 3. For a solidification rate of $V_s$, the amount of latent heat that has to be removed from the melted first article of semiconducting material is:

$$q_c = (LW)V_s \rho \Delta H \quad (1)$$

Where for a rectangular embodiment of a first article of semiconducting material, for example, L is the length, W is the width, ρ is the density, and ΔH is the latent heat of fusion (e.g., 1800 J/g for silicon). By way of example, in order to maintain a constant solidification speed of 100 microns/sec in a 15 cm by 15 cm silicon sheet, a heat removal rate of about 10 kW is required. In at least one embodiment, the solidification speed occurs at a rate ranging from about 10 to about 1000 microns/sec.

The at least one insulating layer may comprise any material that can aid in the management of the heat flux, provided that it is sufficiently stable upon contact with the heated first article of semiconducting material, provides some degree of insulating value, and preferably does not cause contamination of the semiconducting material. Non-limiting examples of materials suitable for the at least one insulating later include silica, alumina, zirconia, yttria, and hafnia, and mixtures and compounds thereof, as well as vitreous forms thereof. The at least one insulating layer may, in various exemplary embodiments, be in a form that imparts thermal resistance, either intrinsically such as in a dense, monolithic form due to the material's (which may include a mixture or solid solution of two or more compounds) thermal conductivity and diffusivity, or by engineering the micro- and/or mesostructure of the material to include a volume fraction of a substantially uniformly distributed material of much lower conductivity. Such materials can take various forms such as, by way of example only, particle beds (of size from nanometers to ~1 mm, i.e. soot to sand); non-woven fabrics such as a felt or veil made from fibers of the refractory materials, including imbedded particulates of same; woven fabrics; and sintered but not fully densified versions of any of the above alone or in combination.

The heat content of the molten first article of semiconducting material may be extracted in any fashion known to those of skill in the art. For example, in one embodiment, the heat flux (inbound) from the top may be reduced in addition to or instead of increasing the heat flux (outbound) from the bottom in order to extract the heat content from the molten first article of semiconducting material. In another embodiment, the heat content of the melted first article of semiconducting material may be extracted by increasing the distance between the heat source and the semiconducting material. In another exemplary embodiment, such as when the heat source comprises a flame, the extraction of the heat content of the molten first article of semiconducting material may be performed by fanning the flame of the heat source over a greater surface area. In yet another embodiment, the heat content of the molten first article of semiconducting material may be extracted by at least one of reducing the temperature of the at least one heat source, controlling the temperature of the at least one substrate, if a substrate is used, and actively cooling.

In various embodiments, the solidification speed and direction may be precisely controlled and the solid-liquid interface may therefore likewise be controlled such that it grows at a velocity lower than the critical velocity for morphological instability. Without wishing to be bound by theory, it is believed that the formation of cellular interfaces and sub-grain boundaries substantially perpendicular to the shortest dimension of the melted first article of semiconducting material may be prevented or minimized by the directional solidification process described herein, thereby leading to higher quality grain structures. By maintaining the temperature gradient substantially parallel to the shortest dimension of the melted first article of semiconducting material, columnar grains may be grown substantially parallel to the shortest dimension of the melted first article of semiconducting material. The columnar grains substantially parallel to the shortest dimension of the melted first article of semiconducting material may minimize the interception of the holes and electrons by inclined grain boundaries, thereby increasing the efficiency of devices comprising the second article of semiconducting material.

Figure 3:
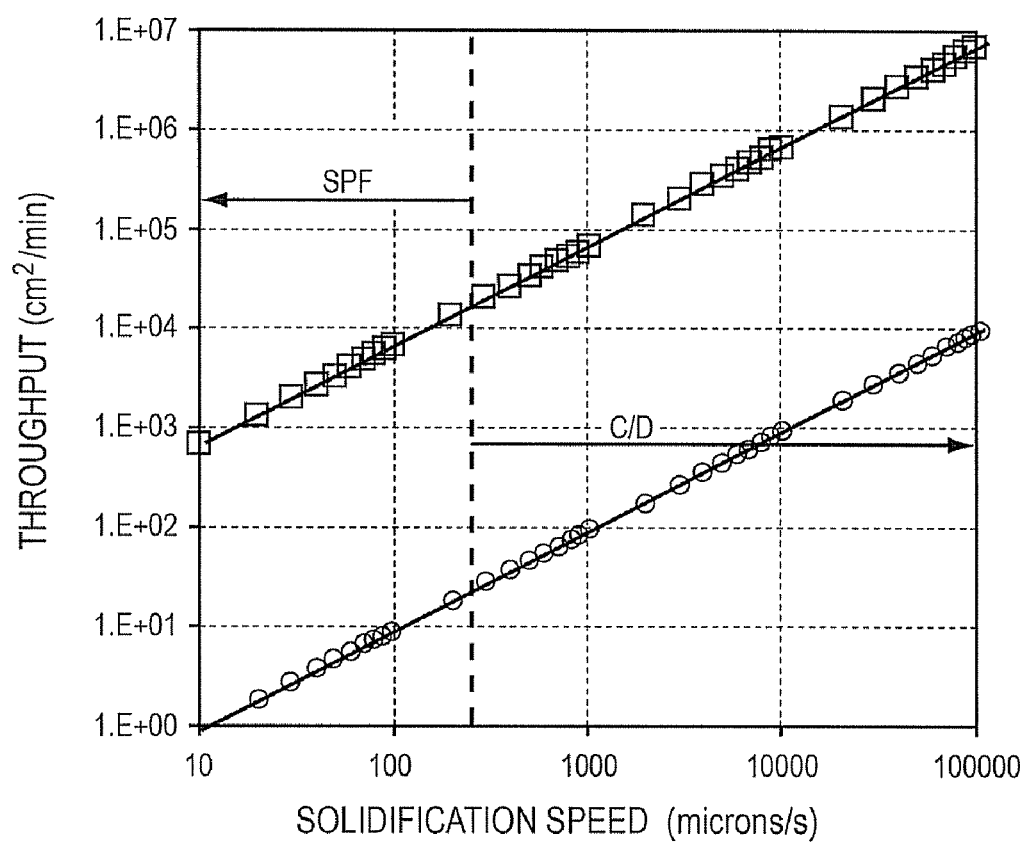
FIG. 3 is a diagram showing the relationship of throughput as a function of solidification speed according to exemplary embodiments.

In various embodiments where high throughput is desired, low solidification speed (about 100 microns/sec) may, in at least some embodiments, be achieved without compromising the throughput by performing directional solidification on a first article of semiconducting material as described herein. While the solidification speed may only be, for example, about 100 microns/sec, the solidification distance may also be relatively small in certain embodiments, such as, for example, about 200 microns, in the vertical direction. Therefore, a processing time of only about 2 seconds may be needed in such an exemplary embodiment for solidification in the direction substantially parallel to the shortest dimension of the melted first article of semiconducting material. This exemplary embodiment demonstrates that solidification at a relatively low speed can be achieved, while still maintaining a high throughput. A calculation of throughput as a function of solidification speed corresponding to both solidification in a lateral direction, discussed above, and solidification in a vertical direction (i.e., directional solidification), as disclosed herein, is shown in FIG. 3. The circles correspond to lateral solidification, the squares correspond to vertical solidification. As seen in FIG. 3, above the experimentally observed "critical scanning speed," shown by the dashed vertical line, the solid-liquid interface may become cellular/dendritic (C/D) leading to sub-grain boundaries in the second article of semiconducting material. The greater the scanning speed beyond this critical scanning speed, the worse may be the defect structure. If the solidification speed is lower than this critical scanning speed, then a stable planar front (SPF) may be obtained at the solid-liquid interface, which may lead to a solidified crystal structure without any sub-grain boundaries.

Another embodiment may involve melting and solidification of regions of the first article of semiconducting material in a direction substantially parallel to the shortest dimension of the melted first article of semiconducting material ("spot melting", rather than melting and solidification across an entire area of the first article of semiconducting material. Spot melting may be done, for example, using a hydrogen torch—the area of the melted region is a function of the overall flame shape and temperature, and may be easily varied on a simple hand torch from multiple square millimeters up to 10 square centimeters. Any focused heat source (radiative or convective/conductive) may be used to accomplish such regional melting and directional solidification. It is also to be understood that the application of a hot spot need not be a singular event. For example, multiple such spots may be applied to a first article of semiconducting material simultaneously. The spots may or may not overlap. However, non-overlapping may result in a poorer microstructure, as there may be a perimeter region that, while receiving a sub-melting anneal, or partial melting (one-sided), may not been totally reconfigured.

In another exemplary embodiment, it may be desirable to partially or completely melt the first article of semiconducting material and solidify in a direction substantially parallel to the shortest dimension of the melted first article of semiconducting material, and then subsequently repeat the partial or complete melting and directional solidification steps at least one additional time. In at least one exemplary embodiment, a process of successive melting and directional solidification may be repeated as many times as desired and may further improve the crystal structure and/or surface properties of the article semiconducting material.

According to various exemplary embodiments of the disclosure, the methods described herein can be practiced under ambient conditions, for example in air, or may be practiced in a controlled environment, such as in an enclosure (e.g., a glove box) containing, for example, argon, hydrogen, or mixtures thereof.

Various exemplary methods of the disclosure may improve at least one of crystal grain structure and surface properties of a first article of semiconducting material by providing a first article of semiconducting material, heating the first article of semiconducting material sufficiently to melt the first article of semiconducting material, and solidifying the first article of semiconducting material in a direction substantially parallel to the shortest dimension of the melted first article of semiconducting material.

It is noted that, as used in this specification and the appended claims, the singular forms "a," "an," and "the," include plural referents unless expressly and unequivocally limited to one referent, and vice versa. Thus, by way of example only, reference to "a heat source" can refer to one or more heat sources, and reference to "a semiconducting material" can refer to one or more semiconducting materials. As used herein, the term "include" and its grammatical variants are intended to be non-limiting, such that recitation of items in a list is not to the exclusion of other like items that can be substituted or added to the listed items.

It will be apparent to those skilled in the art that various modifications and variation can be made to the present disclosure without departing from the scope its teachings. Other embodiments according to the disclosure will be apparent to those skilled in the art from consideration of the specification and practice of the teachings disclosed herein. It is intended that the embodiments described in the specification be considered as exemplary only.

What is claimed is:

1. A method of making a second article of semiconducting material, comprising:

providing a first article of semiconducting material;

prior to heating, forming a first capping layer over a first planar surface of the first article of semiconducting material, forming a second capping layer over a second planar surface of the first article of semiconducting material, and forming at least one insulating layer on at least one vertical sidewall of the first article of semiconducting material;

heating the first article of semiconducting material sufficiently to melt the first article of semiconducting material between the first and second capping layers; and solidifying the melted first article of semiconducting material in a direction substantially parallel to a shortest dimension of the melted first article of semiconducting material.

2. The method of claim 1, wherein the first article of semiconducting material has at least one substantially planar surface.

3. The method of claim 1, wherein the first article of semiconducting material and the melted first article of semiconducting material remain substantially stationary during the solidification step.

4. The method of claim 1, wherein the first article of semiconducting material is provided on at least one substrate.

5. The method of claim 4, wherein the at least one substrate comprises ceramic, glass, graphite, or mixtures thereof.

6. The method of claim 1, wherein the first article of semiconducting material comprises silicon, alloys and compounds of silicon, germanium, alloys and compounds of germanium, gallium arsenide, alloys and compounds of gallium arsenide, alloys and compounds of tin, alloys and compounds of titanium dioxide, and mixtures thereof.

7. The method of claim 1, wherein heating the first article of semiconducting material comprises heating with at least one heat source.

8. The method of claim 1, wherein heating the first article of semiconducting material comprises heating with at least one heat source chosen from a heat reservoir, a lamp, a laser array, a hydrogen and oxygen torch, an electrical discharge source, and an arc lamp, and combinations thereof.

9. The method of claim 1, wherein heating the first article of semiconducting material comprises heating to a temperature ranging from about 900-1600° C.

10. The method of claim 1, wherein heating the first article of semiconducting material comprises heating to a temperature ranging from about 1350-1450° C.

11. The method of claim 1, wherein solidification comprises extracting heat content of the melted first article of semiconducting material at a rate sufficient to provide a substantially uniform temperature gradient in a direction substantially parallel to a shortest dimension of the melted first article of semiconducting material.

12. The method of claim 11, wherein the heat content of the molten first article of semiconducting material is extracted at a rate such that a solid-liquid interface in the melted first article of semiconducting material remains substantially perpendicular to a shortest dimension of the melted first article of semiconducting material.

13. The method of claim 11, wherein the extraction of heat content comprises at least one of reducing a temperature of at least one heat source, actively cooling, and, when the first article of semiconducting material is provided on at least one substrate, controlling a temperature of the at least one substrate.

14. The method of claim 1, wherein the solidification occurs at a rate ranging from about 10 to 1000 microns/second.

15. The method of claim 1, wherein at least one insulating layer is provided on at least one surface of the first article of semiconducting material.

* * * * *